(12) United States Patent
Yang et al.

(10) Patent No.: US 10,013,194 B1
(45) Date of Patent: Jul. 3, 2018

(54) HANDLING THERMAL SHUTDOWN FOR MEMORY DEVICES

(71) Applicant: Western Digital Technologies, Inc., San Jose, CA (US)

(72) Inventors: Nian Niles Yang, Mountain View, CA (US); Varuna Kamila, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/611,958

(22) Filed: Jun. 2, 2017

(51) Int. Cl.
*G11C 7/04* (2006.01)
*G06F 3/06* (2006.01)
*G06F 1/32* (2006.01)

(52) U.S. Cl.
CPC .......... *G06F 3/0619* (2013.01); *G06F 1/3206* (2013.01); *G06F 3/0634* (2013.01); *G06F 3/0647* (2013.01); *G06F 3/0652* (2013.01); *G06F 3/0653* (2013.01); *G06F 3/0685* (2013.01)

(58) Field of Classification Search
CPC .... G06F 3/0619; G06F 3/0634; G06F 3/0647; G06F 3/0653; G06F 3/0685
See application file for complete search history.

(56) References Cited

U.S. PATENT DOCUMENTS

2015/0301744 A1* 10/2015 Kim ............... G06F 3/0679 711/103
2016/0224272 A1* 8/2016 Kim ............... G06F 3/0647
2017/0200492 A1* 7/2017 Yang ............... G11C 11/5642

* cited by examiner

*Primary Examiner* — Pho M Luu
(74) *Attorney, Agent, or Firm* — Patterson & Sheridan, LLP; Steven Versteeg (57) ABSTRACT

The present disclosure discloses a memory device including a controller for handling thermal shutdown of the memory device. The control system acquires temperatures of a plurality of non-volatile memory elements in the memory device from one or more temperature detectors at a first frequency. Upon determining that the temperature of one of the plurality of non-volatile memory elements is above a threshold, the controller activates thermal throttling for the plurality of non-volatile memory elements and flushes metadata from a volatile memory element in the memory device to the plurality of non-volatile memory elements for future recovery of the memory device.

15 Claims, 4 Drawing Sheets

HANDLING THERMAL SHUTDOWN FOR MEMORY DEVICES

BACKGROUND OF THE DISCLOSURE

Field of the Disclosure

Embodiments of the present disclosure generally relate to handling thermal shutdown for memory devices such as solid state drives (SSDs).

Description of the Related Art

Flash memory SSDs have advantages over traditional hard disk drives (HDDs) in that SDDs have a higher throughput, lower read/write latency and lower power consumption. NAND flash memories in particular have a low price and a large capacity compared to other non-volatile memories (NVMs).

NAND flash memories used in SSD systems experience temperature heating effects. When the temperature of a SSD system exceeds a threshold, the SSD system performs a thermal shutdown to protect NAND flash memories and/or other circuit components in the SSD system. The thermal shutdown of the SSD system due to the high temperature is an ungraceful shutdown (UGSD), i.e., an abrupt shutdown. UGSD may cause data loss because the SSD system is unprepared for the abrupt shutdown. Also, recovery of the SSD system after a UGSD is slow because the SSD system needs to regenerate metadata which are lost due to the UGSD.

Therefore, there is a need to handle UGSD for memory devices to reduce data loss and allow faster recovery.

SUMMARY OF THE DISCLOSURE

One embodiment of the present disclosure discloses a memory device. The memory device includes a plurality of NVM elements configured to process a plurality of read/write operations; a volatile memory element configured to store metadata of the memory device; one or more temperature detectors configured to measure temperatures of the plurality of NVM elements; and a controller. The controller is configured to: acquire the temperatures of the plurality of NVM elements from the one or more temperature detectors at a first frequency; and upon determining that the temperature of a first one of the plurality of NVM elements is above a first threshold: activate thermal throttling for the plurality of NVM elements; and flush the metadata from the volatile memory element to the plurality of NVM elements.

Another embodiment of the present disclosure discloses a controller. The controller includes a processor and a memory containing a program that, when executed on the processor, performs an operation. The operation comprises: acquiring temperatures of a plurality of NVM elements in a memory device from one or more temperature detectors at a first frequency; and upon determining that the temperature of a first one of the plurality of NVM elements is above a first threshold: activating thermal throttling for the plurality of NVM elements; and flushing metadata of the memory device from a volatile memory element in the memory device to the plurality of NVM elements.

Another embodiment of the present disclosure discloses a memory device. The memory device includes a plurality of processing means configured to process a plurality of read/write operations; a storing means configured to store metadata of the memory device; one or more measuring means configured to measure temperatures of the plurality of processing means; and a controlling means. The controlling means is configured to: acquire the temperatures of the plurality of processing means from the one or more measuring means at a first frequency; and upon determining that the temperature of a first one of the plurality of processing means is above a first threshold: activate thermal throttling for the plurality of processing means; and flush the metadata from the storing means to the plurality of processing means.

Another embodiment of the present disclosure discloses a method. The method includes acquiring temperatures of a plurality of NVM elements in a memory device from one or more temperature detectors at a first frequency; and upon determining that the temperature of a first one of the plurality of NVM elements is above a first threshold: activating thermal throttling for the plurality of NVM elements; and flushing metadata of the memory device from a volatile memory element in the memory device to the plurality of NVM elements.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1:
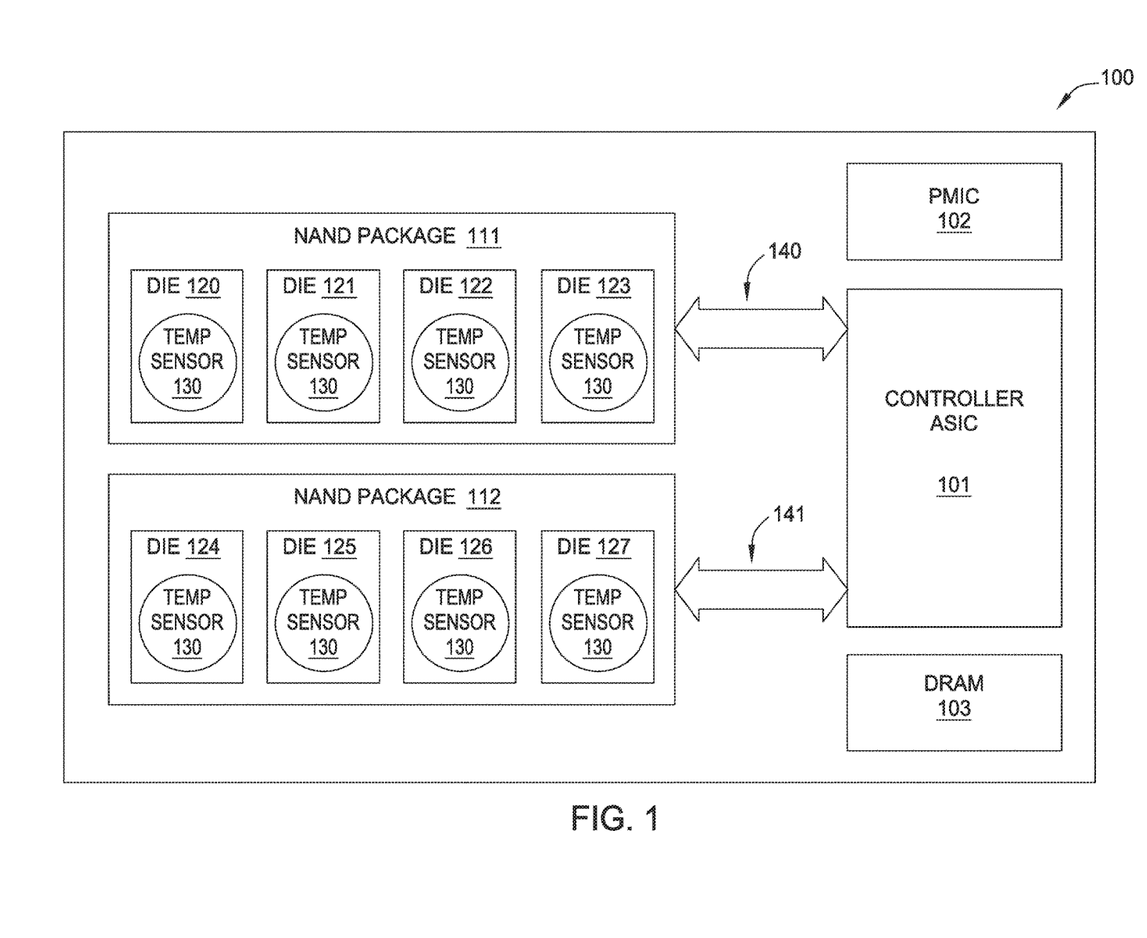
FIG. 1 illustrates a SSD system, according to one embodiment herein.

FIG. 1 illustrates a SSD system 100, according to one embodiment herein. As shown in FIG. 1, the SSD system 100 includes a controller application-specific integrated circuit (ASIC) 101. In one embodiment, the controller ASIC 101 controls the operations of the SSD system 100. For example, the controller ASIC 101 controls the I/O operations of memory elements in the SSD system 100 and the communications among different components of the SSD system 100. In one embodiment, the controller ASIC 101 is mounted on a printed circuit board (PCB) (not shown in FIG. 1). In one embodiment, the controller ASIC 101 includes firmware. For example, the controller ASIC 101 may include a processor and a memory containing a program executed by the processor.

The SSD system 100 also includes a power management integrated circuit (PMIC) 102. In one embodiment, the PMIC 102 monitors and measures power consumption of the SSD system 100. In one embodiment, the controller ASIC 101 instructs the PMIC 102 to shut down the SSD system 100 when the temperature of the SSD system 100 exceeds a threshold.

Moreover, the SSD system 100 includes a dynamic random-access memory (DRAM) 103. In one embodiment, the DRAM 103 stores metadata of the SSD system 100. For example, when the SSD system 100 is initialized and/or in operation, the controller ASIC 101 may generate the metadata and write the metadata data to the DRAM 103. In one embodiment, the metadata includes control data and/or control information for the SSD system 100. For example, the metadata may include but are not limited to: Flash Translation Layer (FTL) logical block address (LBA) tables; cell voltage distribution (CVD) tracking tables; CVD caches; XOR parity bins; boot block updates; file system block updates; and block management tables. In one embodiment, the size of the metadata is from several hundred kilobytes (KB) to around 10 megabytes (MB).

The SSD system 100 further includes multiple memory elements. As shown in FIG. 1, the SSD system 100 includes multiple NAND packages, e.g., the NAND packages 111-112. Each of the NAND package includes one or more memory elements, e.g., NAND dies. For example, as shown in FIG. 1, the NAND package 111 includes NAND dies 120-123, and the NAND package 112 includes NAND dies 124-127.

Each of the NAND dies includes a temperature sensor or a temperature detector 130 attached to the NAND die and measuring the temperature of the NAND die. In one embodiment, the controller ASIC 101 acquires the temperatures of the NAND dies from the temperature sensors 130. For example, the controller ASIC 101 can send a request to each of the temperature sensors 130 attached to the NAND dies 120-123 in the NAND package 111. In response, each of the temperature sensors 130 attached to the NAND dies 120-123 can send the measured temperature of the corresponding NAND die to the controller ASIC 101. The communication between the controller ASIC 101 and the temperature sensors 130 attached to the NAND dies 120-123 is indicated by the bi-directional arrow 140. Similarly, the controller ASIC 101 can send a request to each of the temperature sensors 130 attached to the NAND dies 124-127 in the NAND package 112. In response, each of the temperature sensors 130 attached to the NAND dies 124-127 can send the measured temperature of the corresponding NAND die to the controller ASIC 101. The communication between the controller ASIC 101 and the temperature sensors 130 attached to the NAND dies 124-127 is indicated by the bi-directional arrow 141.

In one embodiment, upon determining that the maximum temperature of the NAND dies is above a pre-determined threshold, the controller ASIC 101 activates thermal throttling for the NAND dies. In one embodiment, during the thermal throttling, the controller ASIC 101 flushes the metadata stored in the DRAM 103 to the NAND dies, which will be described in detail below.

FIG. 1 shows only one embodiment. In other embodiments, the SSD system 100 also includes other components, e.g., system bus and I/O interface, as understood in the art. In other embodiments, multiple NAND dies in one NAND package may share one temperature sensor 130.

Figure 2:
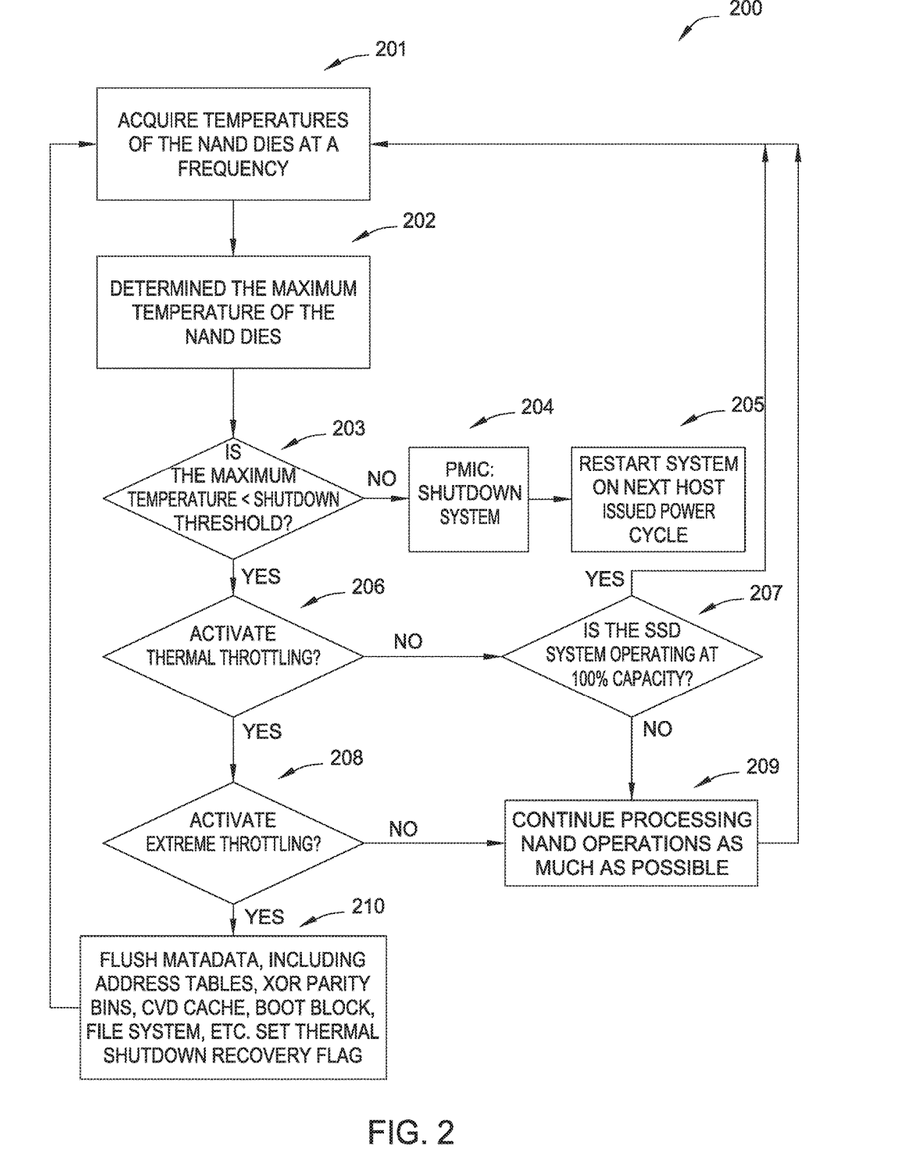
FIG. 2 illustrates a flowchart showing a method for handling UGSD for the SSD system, according to one embodiment herein.

FIG. 2 illustrates a flowchart showing a method 200 for handling UGSD for the SSD system 100, according to one embodiment herein. At block 201, the controller ASIC 101 acquires the temperatures of the NAND dies at a frequency. In one embodiment, the frequency is determined or defined by the requirements of the SSD system 100. In one embodiment, the controller ASIC 101 acquires the temperatures of the NAND dies every 1 second, i.e., at a frequency of 1 Hz. For example, the controller ASIC 101 can send requests to the temperature sensors 130 every 1 second to request the temperatures of the NAND dies 120-127. In other embodiments, the controller ASIC 101 can acquire the temperatures of the NAND dies at a different frequency, as understood by an ordinary person in the art.

At block 202, the controller ASIC 101 determines the maximum temperature of the NAND dies. In one embodiment, the controller ASIC 101 compares all acquired temperatures of the NAND dies in a sampling period and determines the maximum temperature. In one embodiment, the sampling period is the reciprocal of the acquiring frequency, e.g., the sampling period is 1 second when the acquiring frequency is 1 Hz. For example, the controller ASIC 101 acquires the temperatures of the NAND dies 120-127 from the temperature sensors 130 and determines that in the current sampling period the NAND die 121 has the highest temperature or the maximum temperature. In one embodiment, after determining the maximum temperature of the NAND dies, the controller ASIC 101 performs thermal throttling for the NAND dies based on the maximum temperature, as described in the following blocks of method 200.

At block 203, the controller ASIC 101 determines whether the maximum temperature of the NAND dies is below a shutdown threshold. In one example, the shutdown threshold can be 95 degrees centigrade. If the answer at block 203 is "NO", the method 200 proceeds to block 204. At block 204, the controller ASIC 101 instructs the PMIC 102 to shut down the SSD system 100 to protect the NAND dies and/or other circuit components in the SSD system 100. After the SSD system 100 is shutdown at block 204, at block 205, the control ASIC 101 restarts the SSD system 100 in the next power cycle issued by a host device, e.g., a computer using the SSD system 100.

On the other hand, if the answer at block 203 is "YES", the method 200 proceeds to block 206. At block 206, the controller ASIC 101 determines whether to activate thermal throttling for the NAND dies. In one embodiment, if the maximum temperature of the NAND dies is higher than an activation threshold, the controller ASIC 101 will activate the thermal throttling for the NAND dies. In one example, the activation threshold can be 83 degrees centigrade.

If the answer at block 206 is "NO", that is, if the controller ASIC 101 does not activate thermal throttling for the NAND dies (e.g., the maximum temperature of the NAND dies is below 83 degrees centigrade), the method 200 proceeds to block 207. At block 207, the controller ASIC 101 determines whether the SSD system 100 is operating at 100% capacity. For example, at block 207, the controller ASIC 101 may determine whether the NAND dies (e.g., the NAND dies 120-127) in the SSD system 100 are operating using 100% power and/or whether the NAND dies in the SSD system 100 are operating at the highest interface DDR speed, e.g., 500 MHz. If the answer at block 207 is "YES", the method 200 proceeds back to block 201 to continue acquiring the temperatures of the NAND dies at the frequency. If the answer at block 207 is "NO", the method 200 proceeds to block 209. At block 209, the controller ASIC 101 continues processing NAND operations as much as possible. For example, if the NAND dies in the SSD system 100 are operating using 85% power, the controller ASIC 101 continues controlling the NAND dies in the SSD system 100 to operate using 85% power. In another example, if the NAND dies in the SSD system 100 are operating at an interface DDR speed of 400 MHz, the controller ASIC 101 continues controlling the NAND dies in the SSD system 100 to operate at the interface DDR speed of 400 MHz. After block 209, the method 200 proceeds back to block 201 to continue acquiring the temperatures of the NAND dies at the frequency.

On the other hand, if the answer at block 206 is "YES", that is, if the controller ASIC 101 activates thermal throttling for the NAND dies (e.g., the maximum temperature of the NAND dies is higher than 83 degrees centigrade), the method 200 proceeds to block 208. At block 208, the controller ASIC 101 determines whether to activate extreme thermal throttling. In one embodiment, after activating the thermal throttling for the NAND dies at block 206, the maximum temperature of the NAND dies is decreased due to the thermal throttling. For example, in the thermal throttling activated at block 206, the controller ASIC 101 reduces the power allocated to the NAND dies (e.g., allocating 70% power to the NAND dies) and/or controls the NAND dies to operate at a lower interface DDR speed, e.g., 300 MHz. Thus, with the thermal throttling, the NAND dies consume less power and generate less heat so that the temperatures of the NAND dies can be decreased. In one embodiment, after activating the thermal throttling at block 206, the controller ASIC 101 continues acquiring the temperatures of the NAND dies at the frequency, e.g., every 1 second. If the maximum temperature of the NAND dies is decreased due to the thermal throttling, the controller ASIC 101 does not activate the extreme thermal throttling at block 208, and the method 200 proceeds to block 209 as described above.

However, in one embodiment, after activating the thermal throttling for the NAND dies at block 206, the maximum temperature of the NAND dies is not decreased but increased continuously. That is, the thermal throttling activated at block 206 fails to decrease the temperatures of the NAND dies. One reason for the failure may be that one or more of the NAND dies are already broken or malfunctioned due to the high temperature. The broken or malfunctioned NAND dies may cause thermal runaway that continues increasing the temperatures of the NAND dies. Another possible reason is environmental factors such as conductive heating from surrounding heat sources. In one embodiment, after activating the thermal throttling at block 206, the controller ASIC 101 continues acquiring the temperatures of the NAND dies at the frequency, e.g., every 1 second. If the maximum temperature of the NAND dies is not decreased, the controller ASIC 101 activates the extreme thermal throttling at block 208. In one embodiment, if the maximum temperature of the NAND dies is continuously increased to be higher than a second threshold, e.g., 85 degrees centigrade, the controller ASIC 101 activates the extreme thermal throttling at block 208. In one example, in the extreme thermal throttling activated at block 208, the controller ASIC 101 further reduces the power allocated to the NAND dies (e.g., allocating 50% power to the NAND dies) and/or controls the NAND dies to operate at a even lower interface DDR speed, e.g., 200 MHz.

After activating the extreme thermal throttling at block 208, the method 200 proceeds to block 210. At block 210, the controller ASIC 101 flushes metadata of the SSD system 100 from the DRAM 103 to NAND dies and sets a thermal shutdown recovery flag. In one embodiment, the controller ASIC 101 flushes the metadata from the DRAM 103 to the single-level cell (SLC) control blocks in NAND dies 120-127. That is, the controller ASIC 101 writes or copies the metadata stored in the DRAM 103 to the SLC control blocks in NAND dies 120-127. Also, the controller ASIC 101 sets the thermal shutdown recovery flag in the SLC boot block of the NAND dies 120-127. The operations at block 210 will be described in detail below. As described above, the metadata may include but are not limited to: Flash Translation Layer (FTL) logical block address (LBA) tables; CVD tracking tables; CVD caches; XOR parity bins; boot block updates; file system block updates; and block management tables for each of the NAND dies 120-127.

In one embodiment, flushing the metadata from the DRAM 103 to NAND dies takes a short writing period, e.g., 200 microseconds, by performing short SLC writing operations. In one embodiment, the sampling period is longer than the short writing period. Thus, in a sampling period, e.g., 1 second, the controller ASIC 101 can finish the flushing.

In one embodiment, after activating the extreme thermal throttling at block 208, the controller ASIC 101 continues acquiring the temperatures of the NAND dies at the frequency, e.g., every 1 second. In each sampling period, if the controller ASIC 101 determines that maximum temperature of the NAND dies in the sampling period is increased comparing to the maximum temperature in the previous sampling period, the controller ASIC 101 flushes the metadata of the SSD system 100 from the DRAM 103 to NAND dies and sets a thermal shutdown recovery flag. That is, in one embodiment, after activating the extreme thermal throttling at block 208, the controller ASIC 101 flushes the metadata and sets the thermal shutdown recovery flag multiple times in multiple sampling periods. However, the controller ASIC 101 may not flush the metadata and set the thermal shutdown recovery flag in every sampling period.

In one example, if the controller ASIC 101 detects that the maximum temperature of the NAND dies in a current second is higher than the maximum temperature in the previous second, the controller ASIC 101 flushes the metadata of the SSD system 100 from the DRAM 103 to NAND dies once and sets a corresponding thermal shutdown recovery flag in the current second. In another example, if the controller ASIC 101 detects that the maximum temperature of the NAND dies continuously increases in multiple continuous seconds, the controller ASIC 101 flushes the metadata of the SSD system 100 from the DRAM 103 to NAND dies and sets a thermal shutdown recovery flag in every second of the multiple continuous seconds. In another example, if the controller ASIC 101 detects that the maximum temperature of the NAND dies in a current second is below the maximum temperature in the previous second due to the extreme thermal throttling, the controller ASIC 101 does not flush the metadata of the SSD system 100 from the DRAM 103 to NAND dies and does not set the thermal shutdown recovery flag in the current second.

In one embodiment, after activating the extreme thermal throttling at block 208, the controller ASIC 101 continuously controls the NAND dies to operate for a pre-shutdown time period. In one embodiment, the pre-shutdown time period is the period from activating the extreme thermal throttling to shutting down the SSD system 100 when the maximum temperature of the NAND dies is higher than the shutdown threshold (e.g., 95 degrees centigrade).

During the pre-shutdown time period, the controller ASIC 101 flushes the metadata of the SSD system 100 from the DRAM 103 to NAND dies one or multiple times based on the changing of the maximum temperature, as described above. Due to the thermal runaway as described above, the maximum temperature of the NAND dies continuously increases during the pre-shutdown time period. Upon determining that the maximum temperature of the NAND dies is increased to be higher than the shutdown threshold (e.g., 95 degrees centigrade), the controller ASIC 101 instructs the PMIC 102 to shut down the SSD system 100 to protect the NAND dies and/or other circuit components in the SSD system 100. This thermal shutdown is a UGSD. The UGSD may cause the metadata stored in the DRAM 103 (a volatile memory element) to loss. However, the metadata are already stored in the NAND dies (non-volatile memory elements) before the UGSD occurs by performing the flush as described at block 210. Thus, when restarting or recovering the SSD system 100, the controller ASIC 101 can make use of the stored metadata in the NAND dies, instead of regenerating new metadata for restarting the SSD system 100. In this way, recovering time of the SSD system 100 can be reduced.

Figure 3:
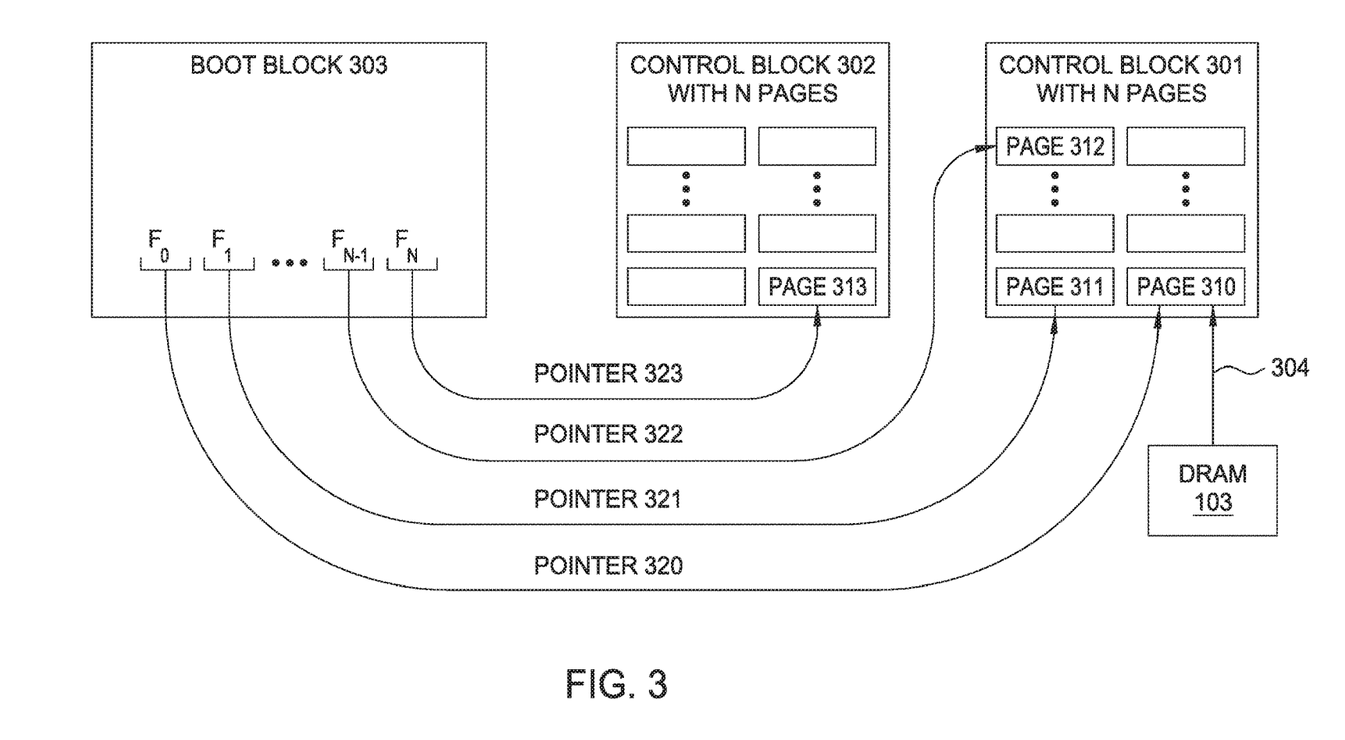
FIG. 3 illustrates flushing metadata data for handling UGSD for the SSD system, according to one embodiment herein.

FIG. 3 illustrates flushing metadata data for handling UGSD for the SSD system 100, according to one embodiment herein. As described above, in a sampling period, the controller ASIC 101 flushes the metadata stored in the DRAM 103 to the SLC control blocks in NAND dies 120-127 and sets the corresponding thermal shutdown recovery flag in the boot block of the NAND dies 120-127. FIG. 3 shows two SLC control blocks 301 and 302 and a boot block 303 in a NAND die. For explanation purpose, it is assumed that the SLC control blocks 301 and 302 and the boot block 303 are memory blocks in the NAND die 121. In one embodiment, the boot block 303 has a fixed location in the NAND die 121. For example, the boot block 303 can be the first memory block in the NAND die 121. As understood in the art, each NAND die, e.g., each of the NAND dies 120-127, includes at least a boot block and multiple SLC control blocks.

Each of the control blocks 301 and 302 includes multiple pages, e.g., N pages, for storing data. In one embodiment, in a sampling period, the controller ASIC 101 flushes the metadata stored in the DRAM 103 to one page in the SLC control blocks 301 or 302. For example, in the first sampling period (e.g., the first second) during the pre-shutdown time period, the controller ASIC 101 flushes the metadata stored in the DRAM 103 to the page 310 in the control block 301, as indicated by the arrow 304. Also, during the first sampling period, the controller ASIC 101 sets a thermal shutdown recovery flag $F_0$ in the boot block 303. In one embodiment, flushing the metadata and setting the thermal shutdown recovery flag are performed by the controller ASIC 101 simultaneously. In another embodiment, the controller ASIC 101 first performs status check to make sure the metadata are successfully flushed and then sets the thermal shutdown recovery flag. For example, after checking that the metadata are successfully flushed to the page 310, the controller ASIC 101 sets the thermal shutdown recovery flag $F_0$ in the boot block 303 of the NAND die 121. In one embodiment, the thermal shutdown recovery flag can be one or a few bytes written to the boot block 303 by the controller ASIC 101.

In one embodiment, the thermal shutdown recovery flag includes a pointer pointing to the corresponding metadata. For example, the thermal shutdown recovery flag $F_0$ includes a pointer 320 pointing to the address in the page 310 storing the metadata flushed in the first sampling period.

Similarly, in the second sampling period during the pre-shutdown time period, the controller ASIC 101 flushes the metadata stored in the DRAM 103 to the page 311 in the control block 301 and sets the thermal shutdown recovery flag $F_1$ in the boot block 303. The thermal shutdown recovery flag $F_1$ includes a pointer 321 pointing to the address in the page 311 storing the metadata flushed in the second sampling period.

Similarly, in the following sampling periods, if the controller ASIC 101 determines that maximum temperature of the NAND dies in the sampling period is increased comparing to the maximum temperature in the previous sampling period, the controller ASIC 101 flushes the metadata and sets the corresponding thermal shutdown recovery flag. That is, before the UGSD occurs, the controller ASIC 101 flushes multiple versions of the metadata to the control blocks 301 and 302. As shown in in FIG. 3, before the UGSD occurs, the controller ASIC 101 flushes totally N+1 versions of metadata and sets N+1 corresponding thermal shutdown recovery flags from $F_0$ to $F_N$. For example, in the second last sampling period before the UGSD occurs, the controller ASIC 101 flushes the second latest version of the metadata to the page 312 in the control block 301. Similarly, in the last sampling period, e.g., the last second, before the UGSD occurs, the controller ASIC 101 flushes the latest version of the metadata to the page 313 in the control block 302.

Also, the controller ASIC 101 sets the respective thermal shutdown recovery flags $F_{N-1}$ and $F_N$ in the boot block 303. The thermal shutdown recovery flag $F_{N-1}$ includes a pointer 322 pointing to the address in the page 312 storing the metadata flushed in the second last sampling period, and the thermal shutdown recovery flag $F_N$ includes a pointer 323 pointing to the address in the page 313 storing the metadata flushed in the last sampling period before the UGSD occurs.

In one embodiment, the controller ASIC 101 flushes the metadata to a first control block, e.g., the control block 301. After the first control block has no more space for storing the metadata, e.g., the N pages in the control block 301 are full of metadata, the controller ASIC 101 flushes the metadata to a second control block, e.g., the control block 302. In one embodiment, the different versions of metadata may include different metadata. For example, the metadata stored in the page 310 can be different from the metadata stored in the page 313. For example, the CVD caches stored in the page 310 can be different from the CVD caches stored in the page 313. In one embodiment, the different versions of metadata may include the same metadata. For example, the metadata stored in the page 310 can be the same as the metadata stored in the page 311. In another example, part of the metadata, e.g., the block management tables, can be the same in some or all of the N+1 versions of metadata.

In one embodiment, after the UGSD occurs, when restarting or recovering the SSD system 100, the controller ASIC 101 can make use of the latest version of metadata stored in the control block of the NAND dies. For example, when restarting or recovering the SSD system 100, the controller ASIC 101 can make use of the metadata stored in the page 313 of the control block 302. The controller ASIC 101 can check the thermal shutdown recovery flag $F_N$ and use the pointer 323 in the thermal shutdown recovery flag $F_N$ to access the metadata stored in the page 313. In another embodiment, after the UGSD occurs, the latest version of metadata, e.g., the metadata stored in the page 313, may be lost due to the UGSD. In this case, the controller ASIC 101 can make use of the second latest version of metadata, e.g., the metadata stored in the page 312 to recover the SSD system 100. Because multiple versions of metadata are stored in the NAND dies before the UGSD occurs, the controller ASIC 101 does not need to regenerate new metadata for recovering the SSD system 100. Instead, the controller ASIC 101 can use the latest available version of metadata stored in the NAND dies to recover the SSD system 100. Using the latest available version of metadata to recover the SSD system 100 may reduce the data loss due to the UGSD.

FIG. 3 shows only one embodiment. In other embodiments, the metadata are stored in one or more cells or subpages of a page in the SLC control blocks. In other embodiments, the metadata flushed in one sampling period can be stored in the multiple pages. For example, part of the metadata flushed in the first sampling period can be stored in the page 310 and another part of the metadata flushed in the first sampling period can be stored in the page 311.

Figure 4:
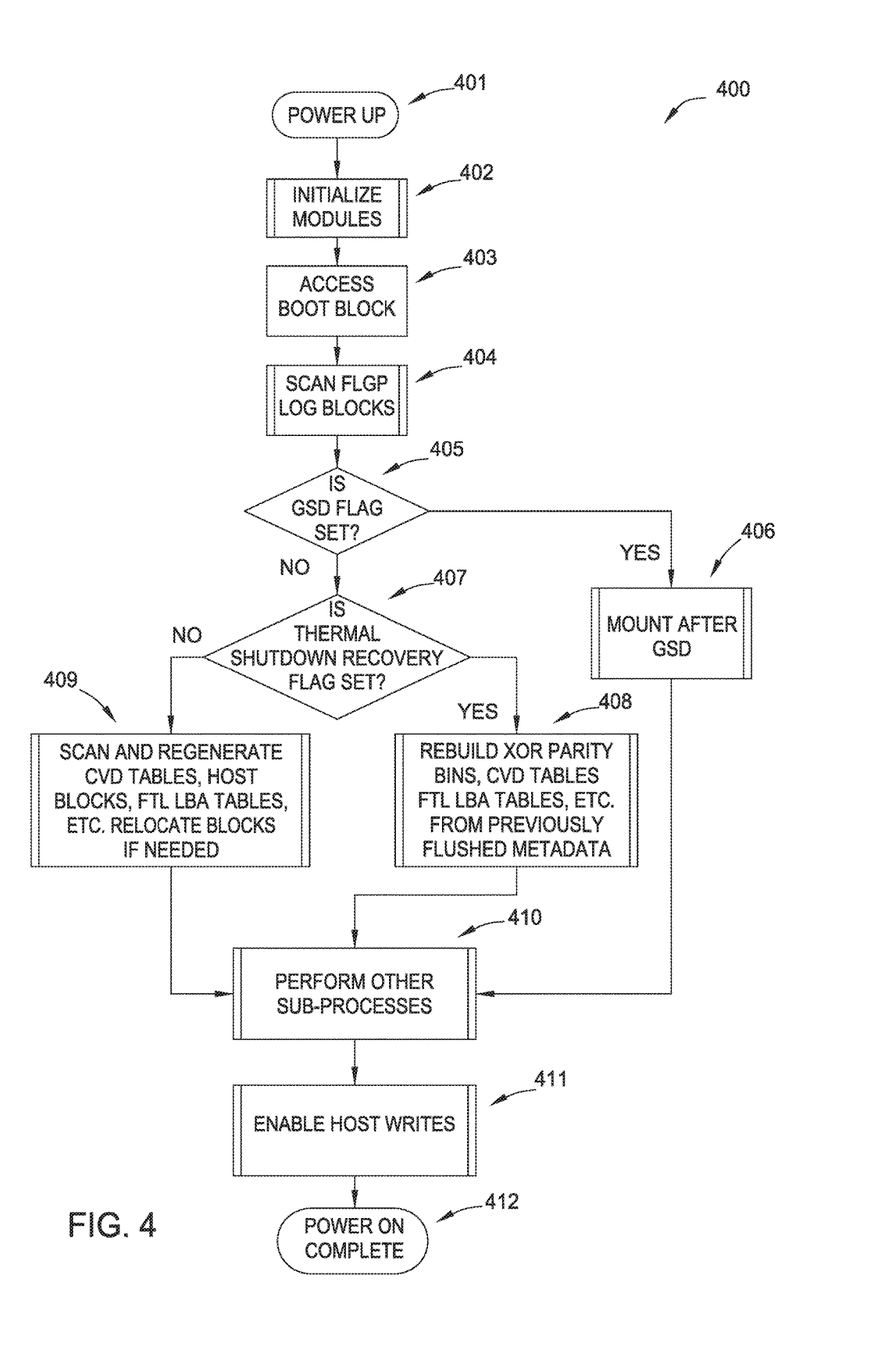
FIG. 4 is a flowchart showing a method for recovering the SSD system, according to one embodiment herein.

FIG. 4 is a flowchart showing a method 400 for recovering the SSD system 100 after a shutdown, according to one embodiment herein. At block 401, after a shutdown occurs, the SSD system 100 is powered up. For example, after a shutdown occurs, the SSD system 100 is powered up in the next power cycle issued by a host device, e.g., a computer using the SSD system 100. At block 402, the controller ASIC 101 initializes modules of the SSD system 100. For example, the controller ASIC 101 initializes the NAND dies 120-127 and the DRAM 103. At block 403, the controller ASIC 101 accesses the boot block 303 of each of the NAND dies 120-127 to check whether a thermal shutdown recovery flag is set for the UGSD in the boot block 303. At block 404, the controller ASIC 101 scans the Find Last Good Page (FLGP) log blocks to find the last good page for the host device or read or write. In one embodiment, the firmware in the controller ASIC 101 scans the FLGP log blocks.

At block 405, the controller ASIC 101 determines whether a flag for a graceful shutdown (GSD) is set. In one embodiment, a GSD is not caused by the high temperature of the NAND dies. For example, a GSD can be caused by the completion of the NAND die read and/or write operations. In one embodiment, before a GSD occurs, the controller ASIC 101 also sets a flag for the GSD in the boot block 303 of each of the NAND dies 120-127. If the answer at block 405 is "YES", it indicates that the shutdown occurred before the SSD system 100 is powered up is a GSD. That is, the shutdown occurred is not a UGSD caused by the high temperature of the NAND dies. The method 400 proceeds to block 406. At block 406, the controller ASIC 101 performs mount after the GSD to generate metadata for the DRAM 103, as understood in the art. Then the method 400 proceeds to block 410. At block 410, the controller ASIC 101 performs other mount sub-processes to configure the DRAM 103. At block 411, the controller ASIC 101 enables host writes such that the host device can write to the SSD system 100. At block 412, the power on of the SSD system 100 is complete. That is, the SSD system 100 is recovered from the shutdown.

On the other hand, if the answer at block 405 is "NO", it indicates that the shutdown occurred is not a GSD. That is, the shutdown occurred is a UGSD. The method 400 proceeds to block 407. At block 407, the controller ASIC 101 determines whether a thermal shutdown recovery flag is set for the UGSD. For example, the controller ASIC 101 checks the boot block 303 of the NAND dies. If the controller ASIC 101 can find one or more thermal shutdown recovery flags, e.g., one or more of $F_0$ to $F_N$, in the boot block 303 of the NAND dies, it indicates that at least one thermal shutdown recovery flag is set for each of the NAND dies. That is, the answer at block 407 is "YES", the method 400 proceeds to block 408.

At block 408, the controller ASIC 101 can use the metadata stored in the NAND dies to recover the SSD system 100. In one embodiment, the controller ASIC 101 can check the thermal shutdown recovery flag and use the pointer in the thermal shutdown recovery flag to access the metadata stored in the SLC control block, as described above. For example, the controller ASIC 101 can use the latest available version of metadata stored in the NAND dies to rebuild the metadata such as XOR parity bins, CVD tracking tables and FTL LBA tables in the DRAM 103. After rebuilding the metadata in the DRAM 103 using the stored metadata in the NAND dies, the method 400 proceeds to block 410, as described above.

If the answer at block 407 is "NO", that is, the controller ASIC 101 checks the boot block 303 of the NAND dies but cannot find any thermal shutdown recovery flags, the method 400 proceeds to block 409. At block 409, the controller ASIC 101 has to regenerate new metadata in DRAM 103 for recovering the SSD system 100. Because the metadata are not stored in the NAND dies, at block 409, the controller ASIC 101 has to scan the SSD system 100 and regenerate new metadata such as the CVD tracking tables, the host blocks and the FTL LBA tables. Also, the controller ASIC 101 has to relocate the host blocks if needed. After regenerating the new metadata, the method 400 proceeds to block 410, as described above.

In embodiments of the present disclosure, the metadata are stored in the NAND dies before the UGSD occurs. Thus, recovering of the SSD system 100 can be performed based on the stored metadata in the NAND dies. That is, the controller ASIC 101 does not need to regenerate new metadata for recovering. Therefore, recovering time of the SSD system 100 is reduced.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising:
a plurality of non-volatile memory elements configured to process a plurality of read/write operations;
a volatile memory element configured to store metadata of the memory device;
one or more temperature detectors configured to measure temperatures of the plurality of non-volatile memory elements; and
a controller configured to:
acquire the temperatures of the plurality of non-volatile memory elements from the one or more temperature detectors at a first frequency; and upon determining that the temperature of a first one of the plurality of non-volatile memory elements is above a first threshold:
activate thermal throttling for the plurality of non-volatile memory elements; and
flush the metadata from the volatile memory element to the plurality of non-volatile memory elements.

2. A memory device, comprising:
a plurality of non-volatile memory elements configured to process a plurality of read/write operations;
a volatile memory element configured to store metadata of the memory device;
one or more temperature detectors configured to measure temperatures of the plurality of non-volatile memory elements; and
a controller configured to:
acquire the temperatures of the plurality of non-volatile memory elements from the one or more temperature detectors at a first frequency; and
upon determining that the temperature of a first one of the plurality of non-volatile memory elements is above a first threshold:
activate thermal throttling for the plurality of non-volatile memory elements; and
flush the metadata from the volatile memory element to the plurality of non-volatile memory elements wherein the metadata comprises one or more of:
Flash Translation Layer (FTL) logical block address (LBA) tables;
cell voltage distribution (CVD) tracking tables;
CVD caches;
XOR parity bins;
boot block updates;
file system block updates; and
block management tables.

3. A memory device, comprising:
a plurality of non-volatile memory elements configured to process a plurality of read/write operations;
a volatile memory element configured to store metadata of the memory device;
one or more temperature detectors configured to measure temperatures of the plurality of non-volatile memory elements; and
a controller configured to:
acquire the temperatures of the plurality of non-volatile memory elements from the one or more temperature detectors at a first frequency; and
upon determining that the temperature of a first one of the plurality of non-volatile memory elements is above a first threshold:
activate thermal throttling for the plurality of non-volatile memory elements; and
flush the metadata from the volatile memory element to the plurality of non-volatile memory elements wherein the controller is configured to flush the metadata from the volatile memory element to a plurality of control blocks in the plurality of non-volatile memory elements.

4. The memory device of claim 3, wherein the plurality of control blocks comprises single level cell (SLC) control blocks.

5. The memory device of claim 3, wherein the controller is configured to flush the metadata by writing the metadata to one or more pages in the plurality of control blocks at the first frequency.

6. A controller, comprising:
a processor;
a memory containing a program that, when executed on the processor, performs an operation, the operation comprising:
acquiring temperatures of a plurality of non-volatile memory elements in a memory device from one or more temperature detectors at a first frequency; and
upon determining that the temperature of a first one of the plurality of non-volatile memory elements is above a first threshold:
activating thermal throttling for the plurality of non-volatile memory elements; and
flushing metadata of the memory device from a volatile memory element in the memory device to the plurality of non-volatile memory elements.

7. A controller, comprising:
a processor;
a memory containing a program that, when executed on the processor, performs an operation, the operation comprising:
acquiring temperatures of a plurality of non-volatile memory elements in a memory device from one or more temperature detectors at a first frequency; and
upon determining that the temperature of a first one of the plurality of non-volatile memory elements is above a first threshold:
activating thermal throttling for the plurality of non-volatile memory elements; and
flushing metadata of the memory device from a volatile memory element in the memory device to the plurality of non-volatile memory elements wherein flushing metadata of the memory device comprises flushing the metadata from the volatile memory element to a plurality of control blocks in the plurality of non-volatile memory elements.

8. A controller, comprising:
a processor;
a memory containing a program that, when executed on the processor, performs an operation, the operation comprising:
acquiring temperatures of a plurality of non-volatile memory elements in a memory device from one or more temperature detectors at a first frequency; and
upon determining that the temperature of a first one of the plurality of non- volatile memory elements is above a first threshold:
activating thermal throttling for the plurality of non-volatile memory elements; and
flushing metadata of the memory device from a volatile memory element in the memory device to the plurality of non-volatile memory elements the operation further comprising setting a flag indicating the metadata in the plurality of control blocks.

9. The controller of claim 8, further comprising setting the flag in a boot block in the plurality of non-volatile memory elements.

10. The controller of claim 8, further comprising setting the flag after successfully flushing the metadata.

11. A method, comprising:
acquiring temperatures of a plurality of non-volatile memory elements in a memory device from one or more temperature detectors at a first frequency; and
upon determining that the temperature of a first one of the plurality of non-volatile memory elements is above a first threshold:
activating thermal throttling for the plurality of non-volatile memory elements; and flushing metadata of the memory device from a volatile memory element in the memory device to the plurality of non-volatile memory elements.

12. The method of claim 11, wherein the first frequency is determined by the memory device.

13. The method of claim 11, further comprising:
upon determining that the temperature of a second one of the plurality of non-volatile memory elements is above a second threshold:
  shutting down the memory device; and
  recovering the memory device in a future power cycle issued by a host device based on the metadata in the plurality of non-volatile memory elements.

14. The method of claim 13, wherein the second threshold is higher than the first threshold.

15. The method of claim 11, wherein flushing metadata of the memory device comprises flushing the metadata upon determining that the temperature of the first non-volatile memory element is not decreased after activating the thermal throttling.

\* \* \* \* \*